United States Patent [19]

Hudson et al.

[11] 4,184,079
[45] Jan. 15, 1980

[54] RADIATION TOUGHENING OF DIAMONDS

[75] Inventors: John A. Hudson, Radley; David J. Mazey, Abingdon; Richard S. Nelson, Reading, all of England

[73] Assignee: National Research Development Corporation, London, England

[21] Appl. No.: 910,127

[22] Filed: May 26, 1978

[30] Foreign Application Priority Data

May 26, 1977 [GB] United Kingdom ............... 22178/77

[51] Int. Cl.² .............................................. A61K 27/02
[52] U.S. Cl. .................................. 250/492 B; 250/310
[58] Field of Search ................... 250/492 B, 306, 309, 250/307, 310

[56] References Cited

U.S. PATENT DOCUMENTS

| | | | |
|---|---|---|---|
| 2,968,723 | 1/1961 | Steigerwald | 250/492 B |
| 2,998,365 | 8/1961 | Custers et al. | 250/492 B |
| 3,806,380 | 4/1974 | Kitada et al. | 250/492 B |
| 3,992,241 | 11/1976 | Ferrari | 250/492 B |

*Primary Examiner*—Harold A. Dixon
*Attorney, Agent, or Firm*—Olbon, Fisher, Spivak, McClelland & Maier

[57] ABSTRACT

A diamond is toughened by bombarding it at elevated temperature with ions such as protons which form a dislocation network in it, inhibiting microcleavage.

11 Claims, No Drawings

RADIATION TOUGHENING OF DIAMONDS

This invention relates to toughening diamonds, that is to improvements in the wear resistance and/or hardness of natural or synthetic diamond.

The invention provides, in one aspect, a method of toughening a diamond (preferably natural diamond), comprising bombarding the diamond with ions of sufficient energy to penetrate the diamond and to cause irradiation damage in the form of a dislocation network thereby inhibiting microcleavage of the diamond, the method taking place at a temperature such that the diamond crystal structure is maintained during the bombardment.

We believe that natural diamond 'wears' by a process of microcleavage and we believe that the present method 'threads' the crystal with defects in the form of a dislocation network thereby inhibiting microcleavage and so improving the wear resistance of the diamond. It is also possible that our method may improve the hardness of the diamond.

We have conducted scratch tests and polishing tests on natural diamond treated by the present method and found that, in comparison with untreated diamond, diamond treated according to the present method polished more slowly when subjected to mechanical abrasion and showed significantly improved scratch resistance to diamond scribes.

The species of ion used in the bombardment is not important. Thus, it may be carbon ions, or any ions other than carbon ions, for example hydrogen cations. Nitrogen ions are suitable since it is known that natural diamonds can contain as much as 0.25 percent nitrogen. What is important is the effect the chosen ion has on the diamond in causing radiation damage. Oxygen is not preferred since it may remove carbon atoms from the diamond. Very heavy ions are also not preferred because at reasonable energies they will have insufficient range to produce a toughened layer of significant depth. The dose of ions is quite small, for example in the range of $10^{16}$ to $10^{18}$ ions cm$^{-2}$ for protons of energies up to 100 keV so that the species actually implanted by the bombardment has no significant effect on the diamond. For example, when carbon ions are used, the total dose is such that there is minimal actual growth of the diamond, equivalent to (say) up to 300 monolayers (about 0.5 μm), which would result if all of a dose of $10^{18}$ ions cm$^{-2}$ contributed to growth. It is, however, most convenient to use protons, where the conditions are selected so that the implanted hydrogen has an insignificant effect on the properties of the diamond; protons need only low-cost equipment and achieve relatively large penetrations into the diamond, giving deeper toughened layers.

The energy of ions used for bombardment must of course be sufficient to penetrate the diamond adequately. It may for example be in the range of 1 keV to 10 MeV.

It should be noted that it need not be necessary for the dislocations produced by the present method to pass completely through the diamond crystals. For example, by using relatively low energy bombardment, for example, 10 keV to 100 keV, the dislocations could be confined to a depth of from 100 Å to 1 μm below the surface of the diamond crystals in order to produce a hard 'skin' on the surface thereof. If it is desired to produce dislocations throughout the diamond crystals being bombarded, higher energies would be required.

The effect of continuing bombardment falls off once a saturation dislocation density is reached, and bombardment may then cease. Indeed, the total dose of implanted ions should be less than that at which impurity effects become noticeable. Where the ions are protons, doses exceeding $10^{18}$ cm$^{-2}$ can result in surface blistering. Carbon ion bombardment does not introduce any impurity, and a certain level of nitrogen is tolerable, as has been mentioned.

The temperature at which the present method is carried out is important since ion bombardment of diamond results in the amorphisation and softening of the surface unless the temperature is held sufficiently high to maintain the crystal structure, for example at a temperature of at least 500° C. However, when diamond is subjected to ion bombardment at high temperatures, there is the possibility of the dislocation structure becoming too coarse and also of the diamond beginning to graphitize, thus losing its crystal structure. It is therefore important that this high temperature is not exceeded. The temperature at which diamond graphitizes is dependent on the purity of the diamond and can be established by simple experiment. A typical temperature for carrying out the present method and which avoids the above mentioned deleterious effect is about 800° C., and a preferred upper temperature limit is 1000° C. In any case, the graphitization temperature must not be exceeded.

Applications of the present method include the following: treatment of die surfaces, diamond grit, diamond needles such as styli, micro-hardness indentors and drilling bits. Also, the present method may be used to treat diamond powder, which may conveniently be bombarded whilst being vibrated, e.g. in an open cup, to ensure that all surfaces of the powder are treated.

The invention will now be particularly described, by way of example only, as follows.

EXAMPLE 1

A diamond macle was irradiated through a mask with 100 keV protons at 800° C. to a dose of $10^{16}$ protons/cm$^2$. A diamond scribe was drawn across those macles with a constant load of 2 kg. Only the areas which had been shielded showed scratches, thus providing evidence of the beneficial effect of the proton bombardment.

EXAMPLE 2

A diamond macle was irradiated at 600° C. over part of its surface with protons to a dose of $5 \times 10^{16}$ protons/cm$^2$ at 60 keV. The diamond was then examined for wear rate by abrasion using a platinum wheel (0.21 μm diameter) revolving at 120 r.p.m. with an applied load of 200 g. The part of the diamond which had been bombarded had an incubation period of 3000 minutes followed by a linear volume wear rate of $5 \times 10^{-10}$ cm$^3$/minute. However, the irradiated part of the diamond, whilst showing a small initial wear during an extended test, exhibited an extremely slow wear rate, namely more than an order of magnitude less than that of the part which had not been irradiated.

EXAMPLE 3

A diamond macle was irradiated at 600° C. to a dose of $5 \times 10^{17}$ protons/cm$^2$ at 100 keV over parts of its surface. A diamond scribe with a load of 4 kg was run over both irradiated and non-irradiated parts of the diamond. Severe crazing was observed in the non-irradiated part of the diamond, whilst the irradiated part was observed to be clear.

EXAMPLE A

This Example is for comparsion, and is not according to the invention.

The procedure of Example 3 was repeated but at ambient temperature and using a reduced load of 1 kg. Negligible effects were observed in the non-irradiated part of the diamond whilst the irradiated part exhibited deep grooving typical of soft, partially amorphous material.

EXAMPLE 4

A diamond machine tool, freshly polished to provide a sharp cutting edge, was used to turn a series of 22 platinum rings. After a standard test, the wear scar on the diamond was measured using optical microscopy and found to be about 20 microns. The same tool was re-lapped to provide a new sharp edge. It was then irradiated at 600° C. with $5 \times 10^{16}$ protons/cm$^2$ at 60 keV over the cutting region. An identical cutting test was carried out and revealed a wear scar of 5 microns.

We claim:

1. A method of toughening a diamond, comprising: bombarding the diamond with ions of sufficient energy to penetrate the diamond and to cause irradiation damage in the form of a dislocation network in the crystal structure which inhibits microcleavage of the diamond, said bombardment occurring at a temperature of at least 500° C. such that the diamond crystal structure is maintained during the bombardment.

2. The method according to claim 1, wherein the diamond is natural diamond.

3. The method according to claim 1 or 2, wherein the number of bombarding ions is from $10^{16}$ to $10^{18}$ per square centimeter.

4. The method according to claim 1 or 2, wherein the ions are protons.

5. The method according to claim 1 or 2, wherein the ions have energies of from 1 keV to 10 MeV.

6. The method according to claim 5, wherein the ions have energies of from 10 keV to 100 keV.

7. The method according to claim 1 or 2, wherein the temperature does not exceed 1000° C.

8. The method according to claim 1 or 2, wherein the diamond is in the form of a powder.

9. The method according to claim 8, wherein the powder is vibrated during the bombardment.

10. A diamond, or diamond powder, toughened by the method of claim 1.

11. The diamond according to claim 10, wherein said toughened diamond is in the form of a die, a needle, a micro-hardness indenter or a drilling bit.

* * * * *